United States Patent
Hossain et al.

(10) Patent No.: US 10,571,970 B2
(45) Date of Patent: Feb. 25, 2020

(54) COMPOSITE MEMBRANE AND METHOD FOR PRODUCING A COMPOSITE MEMBRANE

(71) Applicant: Sefar AG, Heiden (CH)

(72) Inventors: Mohammad Mokbul Hossain, Heiden (CH); Hanspeter Meier, Schachen (CH); Matteo Camani, Arbon (CH)

(73) Assignee: SEFAR AG, Heiden (CH)

( * ) Notice: Subject to any disclaimer, the term of this patent is extended or adjusted under 35 U.S.C. 154(b) by 8 days.

(21) Appl. No.: 15/555,375

(22) PCT Filed: Jan. 13, 2017

(86) PCT No.: PCT/EP2017/050645
§ 371 (c)(1),
(2) Date: Sep. 1, 2017

(87) PCT Pub. No.: WO2017/129418
PCT Pub. Date: Aug. 3, 2017

(65) Prior Publication Data
US 2018/0046223 A1    Feb. 15, 2018

(30) Foreign Application Priority Data
Apr. 14, 2016 (EP) .................................... 16165227

(51) Int. Cl.
*B01D 53/22* (2006.01)
*G06F 1/16* (2006.01)
(Continued)

(52) U.S. Cl.
CPC ....... *G06F 1/1656* (2013.01); *B01D 67/0002* (2013.01); *B01D 69/02* (2013.01);
(Continued)

(58) Field of Classification Search
CPC .. B01D 69/105; B01D 2323/04; B01D 69/02; B01D 69/127; B01D 2323/39;
(Continued)

(56) References Cited

U.S. PATENT DOCUMENTS

| 4,943,473 A | * | 7/1990 | Sahatjian | A41D 27/245 442/289 |
| 2002/0160210 A1 | * | 10/2002 | Kiik | A47G 27/0468 428/458 |

(Continued)

FOREIGN PATENT DOCUMENTS

| JP | 2010030289 A | 2/2010 |
| JP | 2014214398 A | 11/2014 |

(Continued)

OTHER PUBLICATIONS

Partial human translation of JP 2010-30289 A Feb. 12, 2010 Toray Industries et al., 3 pages (Year: 2010).*

(Continued)

*Primary Examiner* — Anthony R Shumate
(74) *Attorney, Agent, or Firm* — Dinsmore & Shohl LLP

(57) ABSTRACT

The invention relates to a composite for an acoustic component having at least one carrier layer and an electrospun membrane which is arranged on the at least one carrier layer, wherein the electrospun membrane is formed of superimposed fibers while a pore structure is being designed. The pore structure of the composite is designed such that the composite has a water column of at least 1 m and an air permeability of 5 $L/m^2*s$. Furthermore, the invention relates to a method for producing a composite for an acoustic component, in which a carrier layer is provided and on the carrier layer a membrane is designed according to the electrospinning method, wherein the membrane is produced of superimposed fibers with a defined pore structure.

12 Claims, 2 Drawing Sheets

(51) Int. Cl.

| | | |
|---|---|---|
| B01D 69/10 | (2006.01) | |
| B01D 69/12 | (2006.01) | |
| B32B 5/02 | (2006.01) | |
| B32B 5/26 | (2006.01) | |
| B32B 7/04 | (2019.01) | |
| B81C 1/00 | (2006.01) | |
| D06M 10/02 | (2006.01) | |
| H04R 7/10 | (2006.01) | |
| H04R 31/00 | (2006.01) | |
| B01D 69/02 | (2006.01) | |
| G10K 13/00 | (2006.01) | |
| B01D 67/00 | (2006.01) | |
| D04H 1/728 | (2012.01) | |
| D06M 10/10 | (2006.01) | |
| D06M 14/18 | (2006.01) | |
| H04R 7/12 | (2006.01) | |
| H04R 29/00 | (2006.01) | |
| D01D 5/00 | (2006.01) | |

(52) U.S. Cl.
CPC .......... *B01D 69/105* (2013.01); *B01D 69/12* (2013.01); *B01D 69/127* (2013.01); *B32B 5/022* (2013.01); *B32B 5/26* (2013.01); *B32B 7/04* (2013.01); *B81C 1/00158* (2013.01); *D04H 1/728* (2013.01); *D06M 10/025* (2013.01); *D06M 10/10* (2013.01); *D06M 14/18* (2013.01); *G10K 13/00* (2013.01); *H04R 7/10* (2013.01); *H04R 31/003* (2013.01); *B01D 2323/04* (2013.01); *B01D 2323/39* (2013.01); *B01D 2325/02* (2013.01); *B01D 2325/38* (2013.01); *B32B 2250/02* (2013.01); *B32B 2250/03* (2013.01); *B32B 2255/02* (2013.01); *B32B 2255/26* (2013.01); *B32B 2262/0238* (2013.01); *B32B 2262/0246* (2013.01); *B32B 2307/10* (2013.01); *B32B 2307/724* (2013.01); *B32B 2307/726* (2013.01); *B32B 2307/7265* (2013.01); *B32B 2307/73* (2013.01); *B32B 2307/754* (2013.01); *D01D 5/0007* (2013.01); *D01D 5/0084* (2013.01); *D06M 2200/11* (2013.01); *D06M 2200/12* (2013.01); *H04R 7/125* (2013.01); *H04R 29/001* (2013.01); *H04R 2307/025* (2013.01); *H04R 2307/029* (2013.01)

(58) Field of Classification Search
CPC ............ B01D 2325/38; B01D 2325/02; B01D 69/12; B01D 67/0002; D06M 10/025; G06F 1/1656; B81C 1/00158; B32B 2250/03; B32B 2307/726; B32B 5/26; B32B 2307/7265; B32B 2255/02; B32B 2250/02; B32B 2307/10; B32B 2262/0238; B32B 7/04; B32B 2307/73; B32B 2307/754; B32B 2255/26; B32B 5/022; B32B 2307/724; B32B 2262/0246; H04R 29/001; H04R 2307/025; H04R 2307/029; H04R 7/10; H04R 31/003; H04R 7/125; G10K 13/00

See application file for complete search history.

(56) References Cited

U.S. PATENT DOCUMENTS

| | | | |
|---|---|---|---|
| 2006/0062998 A1* | 3/2006 | Taylor | B32B 5/022 428/364 |
| 2008/0220676 A1 | 9/2008 | Marin et al. | |
| 2010/0136865 A1 | 6/2010 | Bletsos | |
| 2010/0285301 A1 | 11/2010 | Dieudonne et al. | |
| 2011/0171458 A1* | 7/2011 | Burger | B32B 27/12 428/319.3 |
| 2011/0177741 A1 | 7/2011 | Bryner | |
| 2012/0183746 A1* | 7/2012 | Keene | B32B 3/06 428/193 |
| 2013/0197664 A1 | 8/2013 | Ballard et al. | |
| 2013/0330502 A1* | 12/2013 | Lewis | B32B 5/12 428/90 |
| 2014/0060330 A1 | 3/2014 | Boyat et al. | |
| 2015/0266260 A1* | 9/2015 | Fujioka | B32B 3/30 428/118 |
| 2016/0010251 A1* | 1/2016 | Moegel | D04H 3/14 428/118 |
| 2016/0302507 A1* | 10/2016 | Lewis | B32B 5/022 |
| 2016/0376794 A1* | 12/2016 | Keene | E04F 15/186 428/41.8 |
| 2017/0071389 A1* | 3/2017 | Keene | A47G 27/0206 |
| 2017/0282499 A1* | 10/2017 | LaRocco | B32B 5/022 |
| 2018/0071428 A1* | 3/2018 | Gerdes | A61F 13/00017 |

FOREIGN PATENT DOCUMENTS

| | | |
|---|---|---|
| WO | 2000005000 A1 | 2/2000 |
| WO | 2000014296 A1 | 3/2000 |
| WO | 2009088564 A1 | 7/2009 |
| WO | 2013043397 A2 | 3/2011 |

OTHER PUBLICATIONS

International Search Report and Written Opinion dated Apr. 18, 2017 for PCT/EP2017/050645 filed Jan. 31, 2017.

Japanese Office Action dated Jan. 8, 2019, relating to Japanese Patent Application No. 2017-545921.

Korean Office Action dated Jan. 22, 2019, relating to Korean Application No. 10-2017-7024682.

International Preliminary Report on Patentability/Written Opinion of the International Searching Authority, PCT Application No. PCT/EP2017/050645.

* cited by examiner

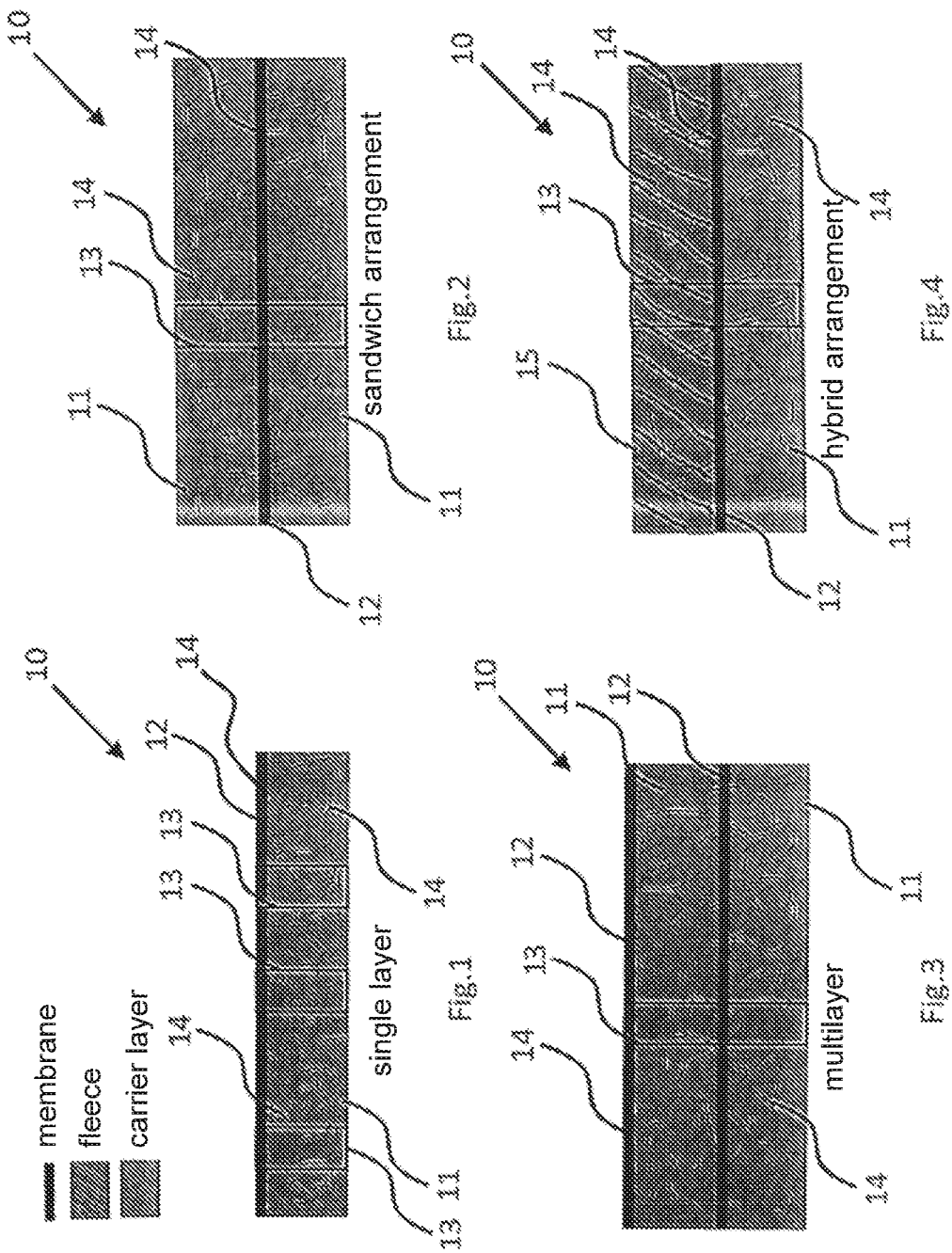

|  | | oil test rating | repellent rating | spray rating |
|---|---|---|---|---|
| variant 1 of the composite | front side | 7 | 5 | 5 |
|  | back side | 7 | 5 | 5 |
| variant 2 of the composite | front side | 6 | 5 | 5 |
|  | back side | 6 | 5 | 5 |
| variant 3 of the composite | front side | 7 | 5 | 5 |
|  | back side | 7 | 5 | 5 |
| variant 4 of the composite | front side | 8 | 5 | 5 |
|  | back side | 7 | 5 | 5 |
| variant 5 of the composite | front side | 7 | 5 | 5 |
|  | back side | 7 | 5 | 5 |
| variant 6 of the composite | front side | 7 | 5 | 5 |
|  | back side | 7 | 5 | 5 | oil drop test according to DIN EN ISO 14419:2010
repellent behavior rating according to Bundesmann test ISO 9865:1991
spray test according to DIN EN ISO 4920:2012

Fig. 5

COMPOSITE MEMBRANE AND METHOD FOR PRODUCING A COMPOSITE MEMBRANE

The invention relates to a composite membrane in accordance with the preamble of claim 1.

The invention further relates to a method for producing a composite membrane in accordance with the preamble of claim 9.

A generic composite membrane and a method for the production thereof can be taken from US 2011/0177741 A1. A non-woven textile with a carrier layer and a barrier layer that are both composed of fibers is described.

From US 2008/0220676 A1 a garment having a fabric layer and a layer of coated nanofibers can be taken. Initially, the layer of nanofibers is produced which is subsequently provided with a liquid coating. Afterwards, the fiber layer thus coated is joined to a fabric layer.

US 2010/0136865 A1 relates to a non-woven web of coated nanofibers.

A composite textile for a garment having an inner fabric layer, an outer fabric layer and a barrier layer consisting of a non-woven membrane of fibers can be taken from WO 2013/043397 A2. The fiber membrane is provided with a plasma coating before being joined to the fabric layers.

US 2013/0197664 A1 describes a filter medium with an electrospun membrane which is applied to a support structure. The support structure can consist of metal, ceramics, fiberglass, graphite or a polymer material.

An acoustic component with a microporous membrane for electronic devices can be gathered from US 2014/0060330 A1. The acoustic component has a microporous membrane layer, to which a layer of fine fibers is applied. Here the microporous membrane layer serves as a supporting layer.

With increasing technological development in the field of the reproduction of acoustic signals there is a constant need to protect the partly sensitive components against external influences.

One of the challenges in this regard is to prevent the access of harmful liquids or nanoscale dust to the electronic parts of an acoustic component whilst not distorting the sound impression.

The invention is based on the object to provide a composite membrane and a method for producing a composite membrane which allow for high protection against the harmful influence of liquids, such as moisture, sweat, grease and/or oils, as well as dust and dirt.

According to the invention the object is achieved on the one hand by a composite membrane having the features of claim 1 and by a method for producing a composite membrane having the features of claim 9. Preferred embodiments of the invention are stated in the respective dependent claims.

The composite membrane according to the invention is characterized in that the composite has at least one carrier layer and an electrospun membrane which is arranged on the at least one carrier layer, wherein the electrospun membrane is formed of superimposed fibers whilst a pore structure is being designed, wherein the pore structure is designed such that the composite has a water column of at least 1 m and an air permeability of 5 $L/m^2 *s$. The fibers can be designed as nanofibers or microfibers for forming a nanostructure or microstructure. The fibers preferably form a three-dimensional non-woven network. Such a composite also meets particularly stringent protection class requirements. The air permeability is determined according to ISO Standard 9237:1995-12 and the water column according to ISO Standard 811:1981.

Furthermore, the method according to the invention for producing a composite membrane is characterized in that a carrier layer is provided and on the carrier layer a membrane is designed according to the electrospinning method, wherein the membrane is produced of superimposed fibers with a defined pore structure. The defined pore structure relates, in particular, to a defined pore size and a defined pore distribution. This can be especially advantageous for a high porosity of the composite.

A basic idea of the invention resides in the fact that a composite is provided, in which case the composite is formed with a high porosity that enables gases, in particular air, to pass through while liquids are retained by the composite.

The membrane of the composite according to the invention, which is produced pursuant to the electrospinning method, differs from other (polymer) membranes in particular by a multilayered net-like, three-dimensionally cross-linked nest-like or grid-like structure with a high specific surface, i.e. a high surface-to-volume-ratio. Conventional membranes used for water-repellent applications, such as polytetrafluoroethylene (PTFE—Gore-Tex®), expanded polytetrafluoroethylene (ePTFE) as well as classical membranes, have a laminar, dense film structure. Due to this structure these membranes are almost impermeable to air (0 $L/m^2 *s$).

The known "breathable" property of film membranes, especially PTFE-membranes, is in fact not attributable to a pore structure but rather to a direct interaction of the membrane material with water vapor.

In addition, especially the PTFE- and ePTFE-membranes can contain residues of harmful raw materials and traces of long-chain perfluoroalkyl acids such as perfluorooctanoic acid (PFOA). According to the invention the composite is free of chlorine and bromine. In particular, according to IEC 61249-2-21 (bromine<900 ppm, chlorine<900 ppm, total proportion of halogen<1500 ppm), IPC 4101B (bromine<900 ppm, chlorine<900 ppm, total proportion of halogen<1500 ppm) and JPCA ES-01-1999 (bromine<900 ppm, chlorine<900 ppm) the composite according to the invention is free of halogens and environmentally harmful compounds such as PFOA/PFOS (perfluorooctanesulfonic acid).

In accordance with the invention the ability of the composite to retain water is defined by the unit "water column". "Water column" is a unit for measuring the pressure acting on a surface, such as a fabric arrangement or a composite. A pressure of a water column of 1 m is defined as the pressure corresponding to the hydrostatic pressure in a water depth of 1 m. In the present case the indications of the water column refer to a hydrostatic pressure at a water temperature of 20° C., in particular according to ISO 811:1981.

According to the invention a particular water column of the composite according to the invention is present (for instance 5 m) if the composite shows no significant permeability to water when a corresponding hydrostatic pressure acts on one side on the composite. Thus, the water column indicated in each case is a measure for the tightness of the composite according to the invention with respect to water.

By preference, the composite according to the invention has a water column of 5 m, preferably of 10 m, by particular preference of 35 m.

The air permeability of the composite as claimed according to the invention is based on a pressure difference measurement made at 20° C. and 65% relative humidity. In the measurement, the increased pressure applied on one side to the composite amounts to 200 Pa (Pascal) and the test surface amounts to 20 cm² of the composite, in particular according to ISO 9237:1995-12.

The volume of air passing through the composite under these conditions corresponds to 1/500 of the volume flow that passes through 1 m² of the composite in 1 second (L/m²*s). The volume flow of air passing through 1 m² of the composite in 1 second is the air permeability as claimed in accordance with the invention.

By preference, the air permeability of the composite amounts to 10 L/m²*s, preferably 30 L/m²*s, by particular preference 50 L/m²*s.

A preferred embodiment of the composite according to the invention resides in the fact that the composite is provided with a plasma coating according to the PECVD method. By preference, the plasma coating is designed such that it complements the properties of the composite by providing, in particular, a roll-off effect (so-called lotus effect), an antistatic effect and/or a non-stick coating. At any rate, however, the crosslinked plasma polymer, i.e. the plasma coating, can contribute to the oil-, grease- and/or water-repellent properties of the composite. Preferably, the composite, in particular the plasma coating, has a low surface energy with a water contact angle of at least 120°, by particular preference with a water contact angle of 140° or more, in line with the measurement according to DIN 55660-2:2011-12.

Embodiment variants of the composite according to the invention were subjected to the oil drop test according to DIN EN ISO 14419:2010. As can be taken from FIG. 5, all embodiments show a good (6) up to very good (8) rating. In (water) spray tests according to DIN EN ISO 4920:2012 and the determination of the roll-off effect in line with the Bundesmann test according to ISO 9865:1991 all embodiments of the composite according to the invention were able to score the highest rating (5 of 5).

Plasma-enhanced chemical vapor deposition (PECVD) is a method for coating surfaces, in which the chemical deposition of a coating substrate is assisted by plasma. The plasma can be generated directly with the substrate to be coated (direct plasma method) or in a separate chamber (remote plasma method). For example due to accelerated electrons a dissociation of molecules of the reaction gas to reactive plasma particles, for instance radicals and ions is caused (plasma), which can bring about the layer deposition on the substrate. In this way, a surface coating can be made available which, compared to conventional wet chemical polymerization methods, provides a highly crosslinked polymer structure but does not seal the pores of a coated membrane.

The carrier layer according to the invention is a monofilament fabric that assumes, in particular, a supporting and/or protective function with respect to the membrane. By preference, the carrier layer is formed with low acoustic impedance, water-, oil-, grease- and/or dust-repellent properties. A precise choice of the carrier layer, in particular its yarn count, geometry, surface property and proportion of open surfaces, can have a significant impact on the final composite function. The higher the air permeability of a medium, the lower is its acoustic impedance and the higher is its permeability to sound. The fabric preferably has a diameter of the filament or yarn of 10 μm to 400 μm and a mesh opening of up to 300 μm. The composite according to the invention is especially well-balanced with regard to its acoustic properties and its protective properties. It is possible to create custom-made composites with regard to a defined porosity and a defined density of plasma-functional groups.

According to the invention the plasma coating is designed both on the electrospun membrane and on the at least one carrier layer. This ensures a flexible use of the composite, in which case the oil-, grease- and/or water-repellent property of the composite can be ensured irrespective of whether the carrier layer is arranged such that it faces towards the acoustic component or away therefrom. In this connection it is especially preferred that the plasma particles penetrate the pores of the composite and envelop or surround the fibers individually with the coating. During plasma polymerization the density of the functional groups and the type of plasma polymer can be influenced.

According to a further development of the invention it is particularly preferred that the plasma coating is formed of a material with hydrophobic and/or oleophobic property. The plasma coating can contribute to an enhancement of the oil-, grease- and/or water-repellent properties of the composite, more particularly the properties of the electrospun membrane.

A preferred further development of the composite according to the invention resides in the fact that the material comprises at least saturated, monounsaturated and/or polyunsaturated ethers, ketones, aldehydes, alkenes, alkynes, amides, amines, nitriles, thioethers, carboxylic acid esters, thioesters, sulfones, thioketones, thioaldehydes, sulfenes, sulfenamides, fluoroacrylates, siloxanes, epoxides, urethanes and/or acrylates. Especially preferred are materials which, on application of a plasma coating method, release radicals or ions that contribute to a non-polar teflon-like surface on the composite.

According to a further development of the composite according to the invention it is preferred that the carrier layer is firmly joined to the membrane. This can prevent delamination and/or a relative displacement of the layers. The carrier layer can be joined to the membrane in a marginal region of the composite in a continuous fashion or at certain points on the circumference as well as in an inner region of the composite in a linear or punctiform fashion.

To form a particularly robust composite it is advantageous in accordance with the invention if the membrane is arranged between two carrier layers. Thus, at least three layers can be provided. In this case the membrane can be covered at least partially on both sides by carrier layers. As required, the at least two carrier layers can have the same (sandwich arrangement) or different properties (hybrid arrangement) that can complement each other in their effect. For instance a first carrier layer can be designed with a hydrophobic, i.e. an oil-, grease- and/or water-repellent property, while the second carrier layer can, in particular, be of dust-repellent, e.g. antistatic design. It is especially preferred that depending on application-specific functional requirements several carrier layers and several membranes are arranged in an alternating manner in the composite. The individual carrier layers and membranes can be designed e.g. with different porosity, pore distribution, hydrophobicity, oleophobicity and a different dust-repellent property.

According to a particularly expedient further development of the composite according to the invention it is advantageous if the membrane is formed with an average pore diameter of 0.08 μm to 100 μm. The average pore diameter can be adjusted as early as in the production of the membrane according to the electrospinning method and can be adapted to the requirements of the composite as needed. By preference, the pore diameter of individual pores deviates from the average pore diameter by not more than 500%, preferably by not more than 300%, by particular preference by not more than 100%. Preferably, the fibers of membranes are formed with a diameter ranging from 40 nm to 500 nm, by particular preference ranging from 80 nm to 250 nm. The diameters of individual fibers of a membrane preferably have similar diameters. In particular, the diameter of individual fibers differs from a medium fiber diameter by less than 500%, preferably 300%, by particular preference by less than 100%.

The membrane according to the invention can also be used for example in medical technology, filter technology, in acoustic vents, ventilation filters, for fuel filtration, for water separation, at clothing, at packaging, at construction and electronic sealings, at shoes, at wound dressings or at face masks. The individually adjustable porosity of the composite according to the invention can contribute beneficially e.g. to a separation of solids in a gas flow or provide a breathable dressing that can be used in wound treatment.

A fundamental idea of the method according to the invention resides in the fact that an electrospun membrane is designed on a carrier layer. The membrane can be formed with a defined porosity, i.e. at least with a defined pore size and/or pore distribution, in which case a density of membrane-forming fibers is adjusted. The proportionate spatial volume of the fibers as well as the average number of fibers in a considered volume of the membrane can be adjusted. In this, the carrier layer can serve, in particular, as a stabilizing and/or protective support for the membrane.

For a particularly reliable coupling and embedding of the individual composite layers it may be advantageous according to the invention if the membrane is firmly joined to the carrier layer by means of a hot melt method, in particular by means of a laser, through ultrasonic welding, laminating, adhesive bonding, plasma treatment or a combination thereof. Adhesive bonding can be carried out, in particular, with an epoxy, acrylate and/or polyurethane adhesive. In this way, delamination can be prevented reliably. It is especially preferred that the joining locations between carrier layer and membrane are provided in a punctiform or linear manner and are distributed evenly over the composite, which can be beneficial to only a small loss of porosity and air permeability.

For an especially efficient production method of the composite according to the invention it can be advantageous according to a further development if the electrospun membrane is produced directly on the carrier layer, wherein the membrane becomes firmly joined to the carrier layer. Basically, it is possible to produce the membrane according to the electrospinning method on a first carrier layer, for example a carrier fleece or a carrier fabric, and to transfer this in a second step to the carrier layer according to the invention, for example a fabric, by way of a delamination-lamination-method. The direct provision of the membrane on the carrier layer according to the invention can prevent laborious transfer processes of the membrane. Furthermore, the surface of the carrier layer can be modified chemically and/or morphologically, whereby the membrane, when being designed, can adhere to the carrier layer in a particularly positionally firm manner.

The membrane can be made available with a layer thickness of less than 100 µm, in particular less than 50 µm, preferably with a layer thickness of 1 to 10 µm. According to the invention a membrane with these small layer thicknesses can already contribute to the water column and air permeability according to the invention.

According to a further development of the method pursuant to the invention it is envisaged that at least one further carrier layer is provided which is also joined to the membrane, wherein the membrane is arranged between the carrier layers. To protect the membrane e.g. against mechanical influences in an aggressive environment it can be provided on both sides with a carrier layer each. In a so-called multilayer structure the composite can be designed with a least two carrier layers and at least two membrane layers each, wherein the membrane layers are arranged on top of each other. By preference, at least one carrier layer is arranged between the first membrane and the at least second membrane.

In accordance with the method pursuant to the invention it is especially preferred that the composite is provided with a surface coating according to a plasma coating method, whereby the introduction of specific functional groups on the surface of the composite or the modification of the composite surface is rendered possible. By means of the nano-coating the oil-, grease-, dirt and/or water-repellent properties of the composite can be influenced in a particularly advantageous way, in which case the porosity and/or air permeability of the coated membrane substantially corresponds to that in the uncoated state. By means of plasma coating a thin film with a specific surface function (in particular hydrophobic and/or oleophobic) is applied to the surface of the composite, more particularly on the individual fibers of the membrane and/or the individual fibers or filaments of the carrier layers. In doing so, especially thin layer thicknesses of a few nm (nanometers), in particular amounting to less than 80 nm, preferably from 5 nm to 40 nm, can be attained. These ultra-thin plasma layers are negligibly small in relation to the pore diameter. Thus, the pore diameter of a membrane pursuant to the invention is basically not changed by a coating implemented according to plasma-assisted vapor deposition, such as the PECVD method.

These plasma polymers can have embedded fluorine-containing and/or fluorine-free functional groups which, as compared to classical fluorocarbons, are free of long-chain perfluoroalkyl acids, such as perfluorooctanoic acid (PFOA) or perfluorooctanesulfonic acid (PFOS) as contamination, which have already been identified globally as a threat to the environment.

In the following the invention is described further by way of a preferred exemplary embodiment illustrated schematically in the accompanying drawings, wherein show:

FIG. 1 a schematic cross-sectional illustration of a composite according to the invention in its simplest embodiment ("single layer");

FIG. 2 a schematic cross-sectional illustration of the composite according to the invention in the so-called "sandwich" arrangement;

FIG. 3 a schematic cross-sectional illustration of the composite according to the invention with a multilayer structure ("multilayer");

FIG. 4 a schematic cross-sectional illustration of the composite according to the invention in a "hybrid" arrangement with two different carrier layers; and FIG. 5 a tabular representation of the result of several tests on composites according to the invention.

FIG. 1 shows a cross-sectional view of the composite 10 according to the invention with a carrier layer 11. On the carrier layer 11 a membrane 12 is arranged that is formed according to the electrospinning method and applied onto the carrier layer 11. For an improved adherence of the membrane 12 to the carrier layer 11 the composite can be designed with at least one joining point 13 that firmly joins both layers to each other. This can be a melted or adhesive bonding location in the form of dots or lines. Due to the small layer thicknesses of the carrier material 11 and the membrane 12 the composite can be penetrated completely by the joining point 13 at the joining location.

The composite 10, more particularly the electrospun membrane 12, can be formed with a porosity. The surface of the composite 10 and the fibers of the pores can be coated with a coating that is applied according to the plasma coating method in particular. The surface coating of the fibers is illustrated schematically in the Figures by the depicted dots and lines 14. According to the invention the composite 10 can be completely surface-coated with the plasma polymer. This can also comprise fibers in a region in the pores of the membrane 12, which is positioned internally or deeper in the composite 10. Hence, not only the macroscopic external surface of the composite can be coated but also the microscopic internal surface, i.e. for instance fibers, recesses and uneven parts, in which case the single fibers are enveloped or surrounded individually.

FIG. 2 shows the composite 10 according to the invention in a so-called "sandwich" arrangement. In this, the membrane 12 is arranged between two carrier layers 11, whereby the membrane 12 is protected between the layers against mechanical stress in particular. In an embodiment of the sandwich arrangement an air permeability of 15.6 $L/m^2*s$ could be attained for example. Basically, an air permeability of up to 50 $L/m^2*s$ can also be reached with the sandwich, multilayer or hybrid arrangement.

In every possible arrangement of layers in a composite 10 these can be arranged on top of each other through simple lamination. However, the layers can also be firmly joined to each other by joining points 13, whereby a particularly reliable mechanical strength of the composite 10 can be attained.

In FIG. 3 a multilayer arrangement of the composite 10 (multilayer) is illustrated. In this arrangement carrier layers 11 and membrane layers 12 are provided such that they are supported on top of each other in an alternating manner. According to FIG. 3 two carrier layers 11 and two membrane layers 12 are provided. A multilayer arrangement can also have a random number of carrier layers 11 and/or membrane layers 12. It is also possible that, according to requirement, two membrane layers 12 are provided directly on top of each other between two or more carrier layers. Even in the case of a multilayer arrangement the plasma coating can be provided on the microscopic surface of all membrane layers 12 and carrier layers 11 supported on top of each other. Thus, also in a multilayer structure the plasma coating can be provided on internal surfaces of the composite 10.

FIG. 4 shows a variant of the embodiment of the composite 10 according to the invention, in which the membrane 12 is arranged between a first carrier layer 11 and a second carrier layer 15. Basically, the first carrier layer 11 can be designed as a fabric in particular, whereas the second carrier layer 15 differs from the first carrier layer 11 and can be provided as a fleece in particular. By way of such a "hybrid" arrangement properties of different materials can be combined advantageously in the composite, whereby filter, protective properties and acoustic transmission properties can be realized in an advantageous manner in the composite 10. Also in a hybrid arrangement as shown in FIG. 4 a plasma coating can be provided on the entire surface of the composite 10, in which case the plasma polymerization can also take place within the composite 10 in deeper layers such as within pore apertures.

It is also conceivable to provide a multilayer structure of the composite 10 with different carrier layers 11, 15 and membranes 12 of different design.

FIG. 5 is a tabular representation of the result of the so-called "oil drop test" according to DIN EN ISO 14419: 2010, the Bundesmann test according to ISO 9865:1991 and the (water) spray test according to DIN EN ISO 4920:2012 carried out on composites according to the invention.

In the "oil drop test" the oleophobicity of a surface is determined on the basis of the shape of an oil drop on the surface to be tested, for which standardized oils (1 to 8; FIG. 5) are used. Particularly oleophobic surfaces show especially repellent behavior, whereby the oil drop is in each case present as a droplet on the surface, not only in connection with oils 1 to 5 but also with oils 6, 7 and 8. The best result is represented in this test by rating 8 which corresponds to a formation of droplets in all 8 oils used. According to FIG. 5 all embodiments pursuant to the invention show good (rating 6) to very good (rating 8) oleophobic properties.

Composites according to the invention achieve the highest rating (5 of 5; FIG. 5) in the Bundesmann test as well as in the spray test.

The invention claimed is:

1. Composite membrane having
    at least one carrier layer and
    an electrospun membrane which is arranged on the at least one carrier layer, wherein the electrospun membrane is formed of superimposed fibers, with a pore structure being designed,
    wherein the composite has a water tightness of a water column of at least 1 m and an air permeability of at least 5 $L/m^2*s$,
    wherein
        the carrier layer has a monofilament fabric and
        a plasma coating is applied both to the electrospun membrane and to the monofilament fabric of the at least one carrier layer.

2. Composite membrane according to claim 1, wherein the composite membrane is provided with the plasma coating according to the plasma-enhanced chemical vapor deposition (PECVD) method.

3. Composite membrane according to claim 1, wherein the plasma coating is formed of a material with hydrophobic and/or oleophobic property.

4. Composite membrane according to claim 3, wherein the material comprises at least saturated, monounsaturated and/or polyunsaturated ethers, ketones, aldehydes, alkenes, alkynes, amides, amines, nitriles, thioethers, carboxylic acid esters, thioesters, sulfones, thioketones, thioaldehydes, sulfenes, sulfenamides, fluoroacrylates, siloxanes, epoxides, urethanes and/or acrylates.

5. Composite membrane according to claim 1, wherein the carrier layer is firmly joined to the membrane.

6. Composite membrane according to claim 1, wherein the membrane is arranged between two carrier layers.

7. Composite membrane according to claim 1, wherein the membrane is formed with an average pore diameter of 0.08 μm to 100 μm.

8. Acoustic component, wherein a composite membrane according to claim 1 is provided.

9. Method for producing a composite membrane according to claim 1, in which
    a carrier layer is provided and
    on the carrier layer a membrane is arranged, wherein the membrane (12) is produced according to the electrospinning method of superimposed fibers with a pore structure, wherein
- a monofilament fabric is provided as the carrier layer and
- the composite membrane is treated using a plasma coating method, wherein a surface coating is applied both to the carrier layer with the monofilament fabric and to the electrospun membrane.

10. Method according to claim 9, wherein the membrane is firmly joined to the carrier layer by means of a hot melt method, by means of a laser, by ultrasonic welding, by laminating, by adhesive bonding, by plasma treatment or a combination thereof.

11. Method according to claim 9, wherein the electrospun membrane is produced directly on the carrier layer, wherein the membrane becomes firmly joined to the carrier layer.

12. Method according to claim 9, wherein at least one further carrier layer is provided which is also joined to the membrane, wherein the membrane is arranged between the carrier layers.

* * * * *